United States Patent
Dai et al.

(10) Patent No.: US 10,698,057 B2
(45) Date of Patent: Jun. 30, 2020

(54) CONTROL COMPUTER AND SIGNAL PROCESSING BOARD FOR A MAGNETIC RESONANCE IMAGING SYSTEM

(71) Applicant: Siemens Healthcare GmbH, Erlangen (DE)

(72) Inventors: Guang Bao Dai, Shenzhen (CN); Jian Zhang Jia, Guangdong Province (CN); Yong Chao Zhou, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 166 days.

(21) Appl. No.: 15/465,944

(22) Filed: Mar. 22, 2017

(65) Prior Publication Data

US 2017/0276752 A1 Sep. 28, 2017

(30) Foreign Application Priority Data

Mar. 22, 2016 (CN) .......................... 2016 1 0165441

(51) Int. Cl.
| | | |
|---|---|---|
| *G01R 33/54* | (2006.01) | |
| *G01R 33/32* | (2006.01) | |
| *G01R 33/385* | (2006.01) | |
| *G01R 33/36* | (2006.01) | |

(52) U.S. Cl.
CPC ....... *G01R 33/543* (2013.01); *G01R 33/3607* (2013.01); *G01R 33/3621* (2013.01); *G01R 33/3852* (2013.01)

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 4,070,708 A | 1/1978 | Smallcombe et al. | |
| 7,051,309 B1* | 5/2006 | Crosetto | G06F 9/3867 712/E9.062 |
| 2013/0211259 A1* | 8/2013 | Komistek | A61B 8/5223 600/440 |

(Continued)

FOREIGN PATENT DOCUMENTS

| | | |
|---|---|---|
| CN | 103197269 A | 7/2013 |
| CN | 103549955 A | 2/2014 |
| CN | 203662760 U | 6/2014 |

OTHER PUBLICATIONS

William Bolton "Mechatronics—Electronic Control System in Mechanical and Electrical Engineering" (Fifth Edition), pp. 77-78,; 2014.

(Continued)

*Primary Examiner* — Melissa J Koval
*Assistant Examiner* — Tiffany A Fetzner
(74) *Attorney, Agent, or Firm* — Schiff Hardin LLP (57) ABSTRACT

A control computer for a magnetic resonance imaging system has an analog-to-digital conversion array, a multiplexer array connected to the analog-to-digital conversion array, and a control module that receives at least one input signal via the multiplexer array and the analog-to-digital conversion array. A signal processing board for a magnetic resonance imaging system has a substrate with the aforementioned components thereon that form the aforementioned control computer.

11 Claims, 5 Drawing Sheets

(56) References Cited

U.S. PATENT DOCUMENTS

2013/0293987 A1* 11/2013 Joshi ................. G01R 33/1238
                                                      361/19
2017/0100092 A1*  4/2017 Kruse ................. A61B 8/0875
2017/0276752 A1*  9/2017 Dai ................... G01R 33/3607

OTHER PUBLICATIONS

Chinese Examination Report dated Mar. 5, 2019, for Application No. 201610165441.6.
Zhu Jian Lin, "Microcomputer control technology and system", Beijing Coal Industry Publishing House, pp. 171-172,182/ 1989.
Chinese Office Action dated Mar. 16, 2020, for Application No. 201610165441.6, and English translation attached.

* cited by examiner

CONTROL COMPUTER AND SIGNAL PROCESSING BOARD FOR A MAGNETIC RESONANCE IMAGING SYSTEM

BACKGROUND OF THE INVENTION

Field of the Invention

The present invention relates to the technical field of medical equipment, in particular to a spectrometer and a signal processing board for a magnetic resonance imaging system.

Description of the Prior Art

Magnetic resonance imaging (MRI) is an imaging technology involving biomagnetics and nuclear spin which has advanced rapidly with the development of computer technology, electronic circuit technology and superconductor technology. It uses a magnetic field and radio frequency (RF) pulses to induce oscillation of precessing hydrogen nuclei (i.e. H+) in human tissue, to generate RF signals which are processed by a computer to form an image. If an object is placed in a magnetic field and irradiated by suitable electromagnetic waves to produce resonance therein, and electromagnetic waves released thereby are then analyzed, it is possible to learn the positions and types of the atomic nuclei of which the object is composed. On this basis, a precise three-dimensional image of the interior of the object can be drawn. For instance, a moving picture of contiguous slices can be obtained by performing an MRI scan of the human brain.

A control computer is a controlling part of an MRI system. The control computer is used for generating and outputting radio frequency (RF) signals and magnetic field gradient signals, and also used for receiving and processing RF signals from local coils, etc.

In a control computer in the prior art, RF signals and magnetic field gradient signals are processed by means of fixed signal processing channels (including a receiving channel and a transmitting channel). However, due to the fact that the signal processing channels are fixed, the configurability of the control computer is not high, so it is unlikely to be suitable for many types of MRI system.

SUMMARY OF THE INVENTION

The embodiments of the present invention propose a control computer and a signal processing board for an MRI system, so as to improve configurability.

The technical solution of the embodiments of the present invention is as follows:

According to one aspect of the embodiments of the present invention, a control computer for an MRI system is proposed, comprising:

an analog-to-digital conversion array;

a first multiplexer array connected to the analog-to-digital conversion array;

a control module, for receiving one or more input signals by means of the first multiplexer array and the analog-to-digital conversion array.

One embodiment also comprises: a digital-to-analog converter; or also comprises: a digital-to-analog conversion array; a second multiplexer array connected to the digital-to-analog conversion array; wherein the control module is also used for transmitting one or more output signals by means of the digital-to-analog conversion array and the second multiplexer array.

In one embodiment, the input signal comprises at least one of the following: an RF signal; an RF feedback signal; a magnetic field gradient feedback signal; a control instruction containing a control parameter; and/or the output signal comprises at least one of the following: an RF signal; a magnetic field gradient signal; a control command.

In one embodiment, the control module comprises:

one or more field programmable gate arrays (FPGA); or one FPGA with one or more processor cores integrated therein; or one or more processors and one or more FPGAs; or one or more processors and one or more auxiliary processor arrays; or one or more FPGAs and one or more auxiliary processor arrays; or one or more processors.

One embodiment also comprises:

a first amplifier connected to the first multiplexer array, for amplifying the input signal; and/or a second amplifier connected to the second multiplexer array, for amplifying the output signal.

One embodiment also comprises at least one of the following:

an Ethernet port; a display interface; a controller local area network port; a serial port.

According to one aspect of the embodiments of the present invention, a signal processing board for an MRI system comprises:

a substrate;

an analog-to-digital conversion array arranged on the substrate;

a first multiplexer array arranged on the substrate and connected to the analog-to-digital conversion array;

a control module arranged on the substrate, for receiving one or more input signals by means of the first multiplexer array and the analog-to-digital conversion array.

One embodiment also comprises: a digital-to-analog converter arranged on the substrate; or also comprises: a digital-to-analog conversion array arranged on the substrate; a second multiplexer array arranged on the substrate and connected to the digital-to-analog conversion array; wherein the control module is also used for transmitting one or more output signals by means of the digital-to-analog conversion array and the second multiplexer array.

In one embodiment, the control module comprises:

one or more field programmable gate arrays (FPGA); or one FPGA with one or more processor cores integrated therein; or one or more processors and one or more FPGAs; or one or more processors and one or more auxiliary processor arrays; or one or more FPGAs and one or more auxiliary processor arrays; or one or more processors.

One embodiment also comprises:

a first amplifier arranged on the substrate and connected to the first multiplexer array, for amplifying the input signal; and/or a second amplifier arranged on the substrate and connected to the second multiplexer array, for amplifying the output signal.

It can be seen from the technical solution above that in the embodiments of the present invention, the control computer comprises: an analog-to-digital conversion array; a first multiplexer array connected to the analog-to-digital conversion array; a control module, for receiving one or more input signals by means of the first multiplexer array and the analog-to-digital conversion array. Clearly, the use of the first multiplexer array in the embodiments of the present invention allows any number of input signals of any type to be received. Furthermore, the use of the second multiplexer array in the embodiments of the present invention allows any number of output signals of any type to be outputted. Thus, the embodiments of the present invention can increase configurability and expandability, as well as reducing costs.

Furthermore, in the embodiments of the present invention, a processor core may be integrated in an FPGA, thereby significantly lowering costs. Moreover, in the embodiments of the present invention, the processing performance of the control module can also be improved through the introduction of an auxiliary processor array.

DESCRIPTION OF THE PREFERRED EMBODIMENTS

The present invention is explained in further detail below in conjunction with the accompanying drawings and embodiments, to clarify the technical solution and advantages thereof. It should be understood that the particular embodiments described here are merely intended to explain the present invention elaboratively, not to define the scope of protection thereof.

Figure 1:
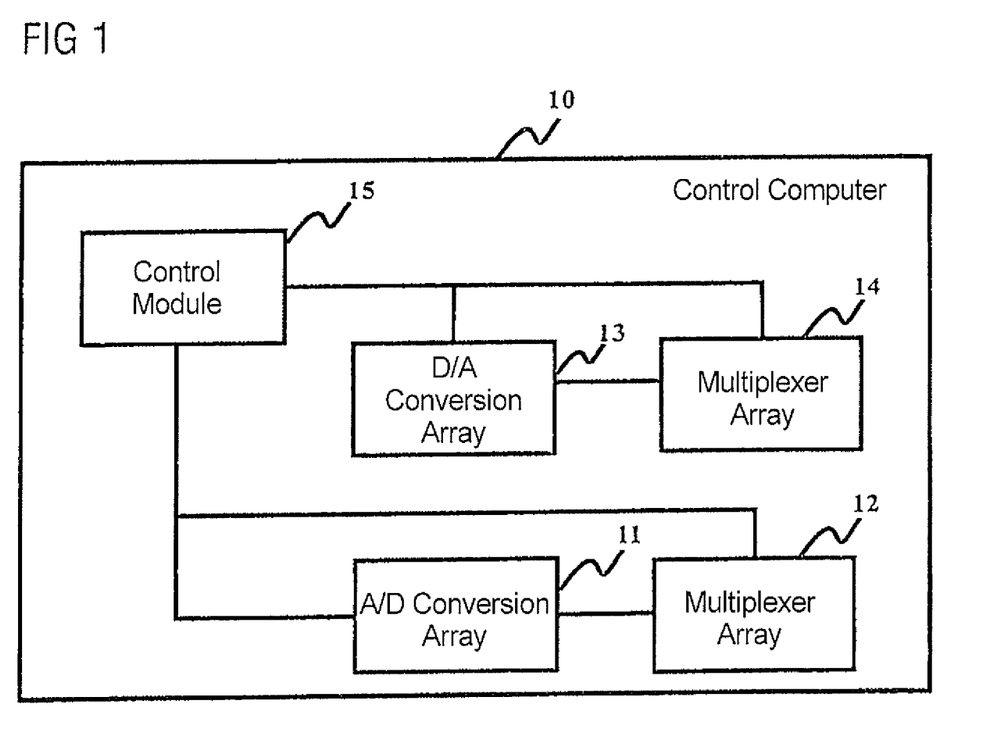
FIG. 1 is a structural diagram of a control computer for an MRI system according to an embodiment of the present invention.

FIG. 1 is a structural diagram of a control computer for an MRI system according to an embodiment of the present invention.

As FIG. 1 shows, the control computer 10 comprises:
an analog-to-digital conversion array 11;
a first multiplexer array 12 connected to the analog-to-digital conversion array 11;
a control module 15, for receiving one or more input signals by means of the first multiplexer array 12 and the analog-to-digital conversion array 11.

In one embodiment, the control computer 10 may also comprise a digital-to-analog converter (not shown in FIG. 1). For example, the digital-to-analog converter may specifically be implemented as one or more digital-to-analog conversion chips. Using the digital-to-analog converter, an output signal fixed processing channel of the control computer 10 may be formed. When there is only one output signal path, the digital-to-analog converter is implemented as one digital-to-analog conversion chip corresponding in a fixed manner to the output signal path; when there are multiple output signal paths, the digital-to-analog converter may be implemented as multiple digital-to-analog conversion chips corresponding in a fixed manner to each output signal path respectively. In such an embodiment, the control computer 10 may receive any number of input signals of any type, but can only use a fixed processing channel to process output signals.

The embodiments of the present invention also propose a preferred embodiment in which any number of output signals of any type may be outputted. In this preferred embodiment, the control computer 10 also comprises:
a digital-to-analog conversion array 13;
a second multiplexer array 14 connected to the digital-to-analog conversion array 13;
a control module 15, also used for transmitting one or more output signals by means of the digital-to-analog conversion array 13 and the second multiplexer array 14.

Clearly, in such a preferred embodiment, due to the use of the second multiplexer array, a fixed processing channel is no longer used to process output signals; instead, any number of output signals of any type may be outputted.

In one embodiment, input signals received by the control computer 10 may comprise: RF signals received by the control computer 10 from a local coil system; RF feedback signals received by the control computer 10 from an RF signal transmission source; magnetic field gradient feedback signals received by the control computer 10 from a magnetic field gradient signal transmission source; control instructions containing control parameters and received by the control computer 10 from outside, etc. For example: the control parameters may include: magnet temperature monitoring signal, patient table position signal, etc.

In one embodiment, output signals transmitted by the control computer 10 comprise: RF signals transmitted by the control computer 10 to a transmit coil system; magnetic field gradient signals transmitted by the control computer 10 to a gradient coil system; control commands transmitted by the control computer 10 to the outside, etc. For example, the control commands may include: patient table position movement commands, magnet temperature control commands, etc.

Specific examples of input signals and output signals are described above by way of demonstration. Those skilled in the art will realize that such a description is purely demonstrative, and not intended to define the scope of protection of the present invention.

The first multiplexer array 12 comprises one or more cascaded multiplexers. The first multiplexer array 12 is used for selecting, on the basis of a control operation of the control module 15, an input channel for transmitting an input signal to the analog-to-digital conversion array 11. The analog-to-digital conversion array 11 may specifically comprise one or more analog-to-digital conversion chips. The analog-to-digital conversion chip executes a signal format conversion operation in which an analog format is converted to a digital format. The analog-to-digital conversion chip is used for converting an input signal in an analog format to a digital format.

The digital-to-analog conversion array 13 may specifically comprise one or more digital-to-analog conversion chips. The digital-to-analog conversion chip executes a signal format conversion operation in which a digital format is converted to an analog format. The digital-to-analog conversion array 13 is used for converting an output signal in a digital format to an analog format. The second multiplexer array 14 comprises one or more cascaded multiplexers. The second multiplexer array 14 is used for selecting, on the basis of a control operation of the control module 15, an output channel for transmitting to an output device an output signal that has undergone digital-to-analog conversion.

In one embodiment, the control computer 10 also comprises: a first amplifier connected to the first multiplexer array 11, for amplifying an input signal.

In one embodiment, the control computer 10 also comprises: a second amplifier connected to the second multiplexer array 14, for amplifying an output signal.

The process by which the control computer 10 receives an RF signal from a local coil of an MRI system specifically comprises: a receiving device (e.g. an RF signal receiving module) connected to the control computer 10 receives an RF signal in analog format from a local coil system of the MRI system; the first multiplexer array 12 selects, on the basis of a control operation of the control module 15, an input channel for transmitting the RF signal in analog format to the analog-to-digital conversion array 11. The control module 15 also selects, from the analog-to-digital conversion array 11, an analog-to-digital conversion chip to execute an analog-to-digital conversion operation. The analog-to-digital conversion chip selected by the control module 15 converts the RF signal in analog format to digital format, then transmits the RF signal in digital format to the control module 15.

The process by which the control computer 10 receives an RF feedback signal and a magnetic field gradient feedback signal specifically comprises: a receiving device (e.g. a feedback signal receiving module) connected to the control computer 10 receives an RF feedback signal from an RF signal transmission source, and receives a magnetic field gradient feedback signal from a magnetic field gradient signal transmission source; the first multiplexer array 12 selects, on the basis of a control operation of the control module 15, an input channel for transmitting the RF feedback signal and/or the magnetic field gradient feedback signal in analog format to the analog-to-digital conversion array 11. The control module 15 also selects, from the analog-to-digital conversion array 11, an analog-to-digital conversion chip to execute an analog-to-digital conversion operation. The analog-to-digital conversion chip selected by the control module 15 converts the RF feedback signal in analog format and/or the magnetic field gradient feedback signal in analog format to digital format, then transmits the RF feedback signal in digital format and/or the magnetic field gradient feedback signal in digital format to the control module 15.

The process by which the control computer 10 transmits an RF signal to a transmit coil of an MRI system specifically comprises: the control module 15 generates an RF signal in digital format; the control module 15 selects, from the digital-to-analog conversion array 13, a digital-to-analog conversion chip to execute a digital-to-analog conversion operation; the digital-to-analog conversion chip selected by the control module 15 converts the RF signal in digital format to analog format; the second multiplexer array 14 selects, on the basis of a control operation of the control module 15, an output channel for transmitting the RF signal in analog format to an output device (e.g. an RF signal transmitting module). The output device then transmits the RF signal in analog format to the transmit coil.

The process by which the control computer 10 transmits a magnetic field gradient signal to a gradient coil of an MRI system specifically comprises: the control module 15 generates a magnetic field gradient signal in digital format; the control module 15 selects, from the digital-to-analog conversion array 13, a digital-to-analog conversion chip to execute a digital-to-analog conversion operation; the digital-to-analog conversion chip selected by the control module 15 converts the magnetic field gradient signal in digital format to analog format; the second multiplexer array 14 selects, on the basis of a control operation of the control module 15, an output channel for transmitting the magnetic field gradient signal in analog format to an output device (e.g. a magnetic field gradient signal transmitting module). The output device then transmits the magnetic field gradient signal in analog format to the gradient coil of the MRI system.

Similarly, the control computer 10 may also receive a control instruction containing a control parameter and/or transmit a control command. This will not be described again in the present invention.

In one embodiment, the control module 15 comprises a field programmable gate array (FPGA), with one or more processor cores integrated therein. By integrating a processor core in an FPGA, the present invention can significantly reduce costs.

In one embodiment, the control module 15 comprises one or more FPGAs. For example, a portion of the FPGAs may be used for logic control of the transmission of output signals, while another FPGA is used for logic control of the reception of input signals.

In another embodiment, the control module 15 comprises one or more processors and one or more FPGAs. The FPGA is used for timing control; the processor is used for signal processing and image processing. The division of labor between the processor and the FPGA can significantly increase processing efficiency.

In one embodiment, the control module 15 comprises one or more processors and one or more auxiliary processor arrays. The auxiliary processor array communicates with the processor, helping the processor to perform calculation and control. In one embodiment, the control module 15 comprises one or more FPGAs and one or more auxiliary processor arrays. The auxiliary processor array communicates with the FPGA, helping the FPGA to perform calculation and control.

Specifically, the auxiliary processor array may be implemented as an array formed of digital signal processors (DSP) or auxiliary processors of any type. When the present invention is used, the processing performance of the control module 15 can be improved through the introduction of the auxiliary processor array.

Specifically, the processor may be implemented as a central processor (CPU) or a microcontrol unit (MCU). Similarly, the processor core may be implemented as a CPU core or an MCU core.

In one embodiment, the control computer 10 also comprises: an Ethernet port, for transmitting a magnetic resonance image to the outside by Ethernet communication, and/or exchanging control commands with the outside. For example, the Ethernet port comprises: an RJ-45 interface, an RJ-11 interface, an SC optic fiber interface, an FDDI interface, an AUI interface, a BNC interface, a Console interface, etc.

In one embodiment, the control computer 10 is also used for generating a magnetic resonance image on the basis of RF signals received from outside. The control computer 10 also comprises: a display interface, for transmitting the magnetic resonance image to the outside. For example, the display interface may specifically be implemented as: a high definition multimedia interface (HDMI), a video graphics array (VGA) interface, etc.

In one embodiment, the control computer 10 also comprises a controller local area network port or a serial port, for exchanging control parameters with the outside.

Particular embodiments of the present invention are explained below.

Figure 2:
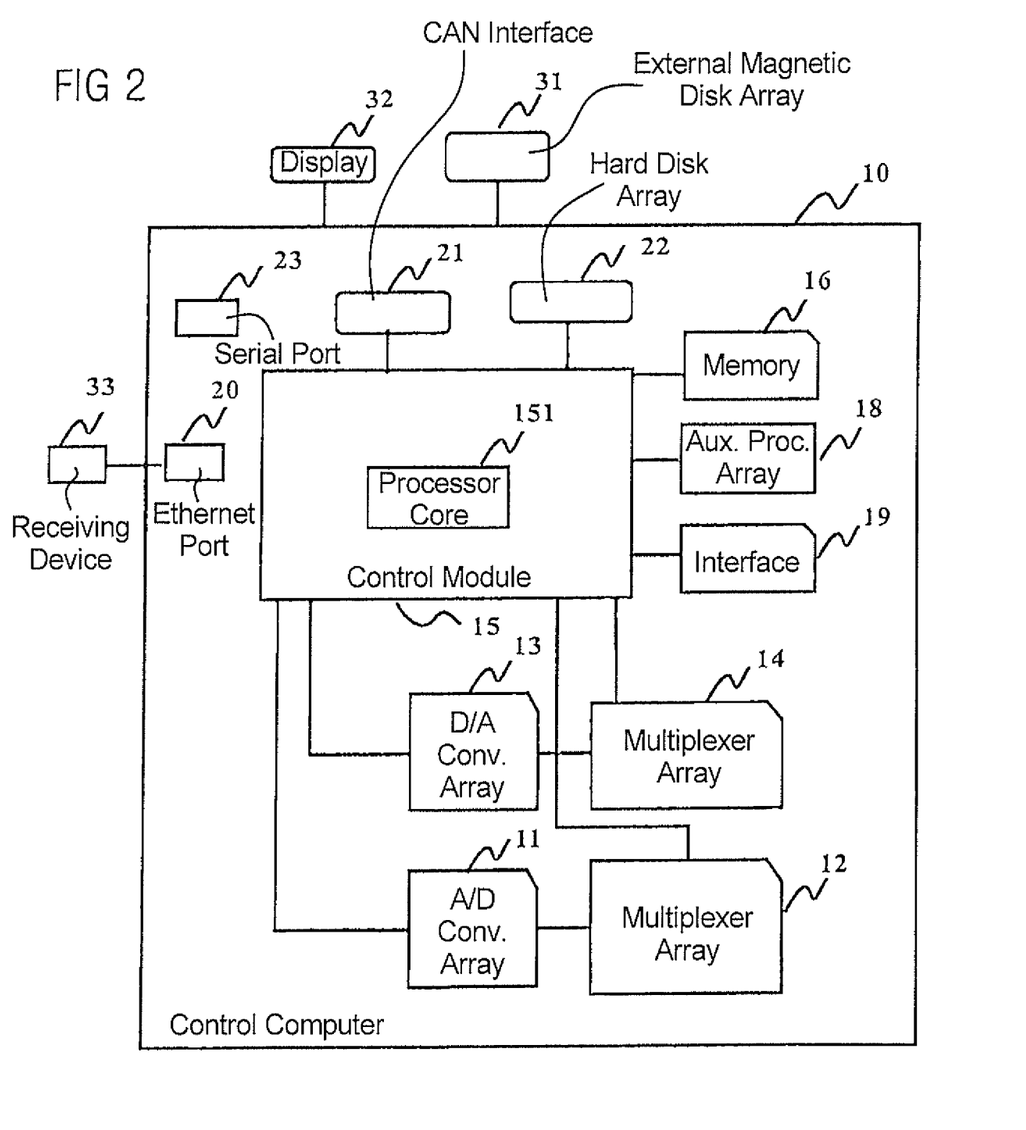
FIG. 2 is a first demonstrative structural diagram of a control computer for an MRI system according to an embodiment of the present invention.

FIG. 2 is a first demonstrative structural diagram of a control computer for an MRI system according to an embodiment of the present invention.

As FIG. 2 shows, the control computer 10 comprises an FPGA 15 with a processor core 151 integrated therein. The FPGA 15 is separately connected to a digital-to-analog conversion array 13 and an analog-to-digital conversion array 11. A first multiplexer array 12 is connected to the analog-to-digital conversion array 11; a second multiplexer array 14 is connected to the digital-to-analog conversion array 13. The first multiplexer array 12 and second multiplexer array 14 are separately connected to the FPGA 15. The first multiplexer array 12 and second multiplexer array 14 may each be connected to respective amplifiers.

The control computer 10 also comprises an auxiliary processor array 18, a CAN interface 21, a solid state hard disk array 22, a control interface 19 and a memory 16 connected to the FPGA 15. The control computer 10 also comprises an Ethernet port 20 and a serial port 23. The control computer 10 can receive control parameters such as magnet temperature monitoring signals and patient table position signals via the CAN interface 21. The control computer 10 can transmit control commands such as patient table position movement commands and magnet temperature control commands via the control interface 19.

The process by which the control computer 10 receives an RF signal from a local coil system of an MRI system specifically comprises: a receiving device (e.g. an RF signal receiving module) connected to the control computer receives an RF signal in analog format from the local coil system of the MRI system; the first multiplexer array 12 selects, on the basis of a control operation of the FPGA 15, an input channel for transmitting the RF signal in analog format to the analog-to-digital conversion array 11. The FPGA 15 also selects, from the analog-to-digital conversion array 11, an analog-to-digital conversion chip to execute an analog-to-digital conversion operation. The analog-to-digital conversion chip selected by the FPGA 15 converts the RF signal in analog format to digital format, then transmits the RF signal in digital format to the FPGA 15.

The process by which the control computer 10 receives an RF feedback signal and a magnetic field gradient feedback signal specifically comprises: a receiving device (e.g. a feedback signal receiving module) connected to the control computer 10 receives an RF feedback signal from an RF signal transmission source, and receives a magnetic field gradient feedback signal from a magnetic field gradient signal transmission source; the first multiplexer array 12 selects, on the basis of a control operation of the FPGA 15, an input channel for transmitting the RF feedback signal and/or the magnetic field gradient feedback signal in analog format to the analog-to-digital conversion array 11. The FPGA 15 also selects, from the analog-to-digital conversion array 11, an analog-to-digital conversion chip to execute an analog-to-digital conversion operation. The analog-to-digital conversion chip selected by the FPGA 15 converts the RF feedback signal in analog format and/or the magnetic field gradient feedback signal in analog format to digital format, then transmits the RF feedback signal in digital format and/or the magnetic field gradient feedback signal in digital format to the FPGA 15.

The process by which the control computer 10 transmits an RF signal to a transmit coil system of an MRI system specifically comprises: the FPGA 15 generates an RF signal in digital format; the FPGA 15 selects, from the digital-to-analog conversion array 13, a digital-to-analog conversion chip to execute a digital-to-analog conversion operation; the digital-to-analog conversion chip selected by the FPGA 15 converts the RF signal in digital format to analog format; the second multiplexer array 14 selects, on the basis of a control operation of the FPGA 15, an output channel for transmitting the RF signal in analog format to an output device (e.g. an RF signal transmitting module). The output device then transmits the RF signal in analog format to the transmit coil system.

The process by which the control computer 10 transmits a magnetic field gradient signal to a gradient coil system of an MRI system specifically comprises: the FPGA 15 generates a magnetic field gradient signal in digital format; the FPGA 15 selects, from the digital-to-analog conversion array 13, a digital-to-analog conversion chip to execute a digital-to-analog conversion operation; the digital-to-analog conversion chip selected by the FPGA 15 converts the magnetic field gradient signal in digital format to analog format; the second multiplexer array 14 selects an output channel for transmitting the magnetic field gradient signal in analog format to an output device (e.g. a magnetic field gradient signal transmitting module). The output device then transmits the magnetic field gradient signal in analog format to the gradient coil of the MRI system.

After receiving RF signals from the local coil system of the MRI system, the control computer 10 can automatically generate a magnetic resonance image, and transmit the magnetic resonance image by Ethernet communication via the Ethernet port 20 to a receiving device 33 located outside the control computer 10. Optionally, after receiving RF signals from the local coil system of the MRI system, the control computer 10 may also generate a magnetic resonance image in cooperation with an external computing resource. In this case, the Ethernet port 33 of the control computer interacts with the external computing resource 33 by Ethernet communication, to cooperatively generate a magnetic resonance image. The control computer 10 may also be connected to a display 32 and an external magnetic disk array 31 via the serial port 23, to display a magnetic resonance image.

Figure 3:
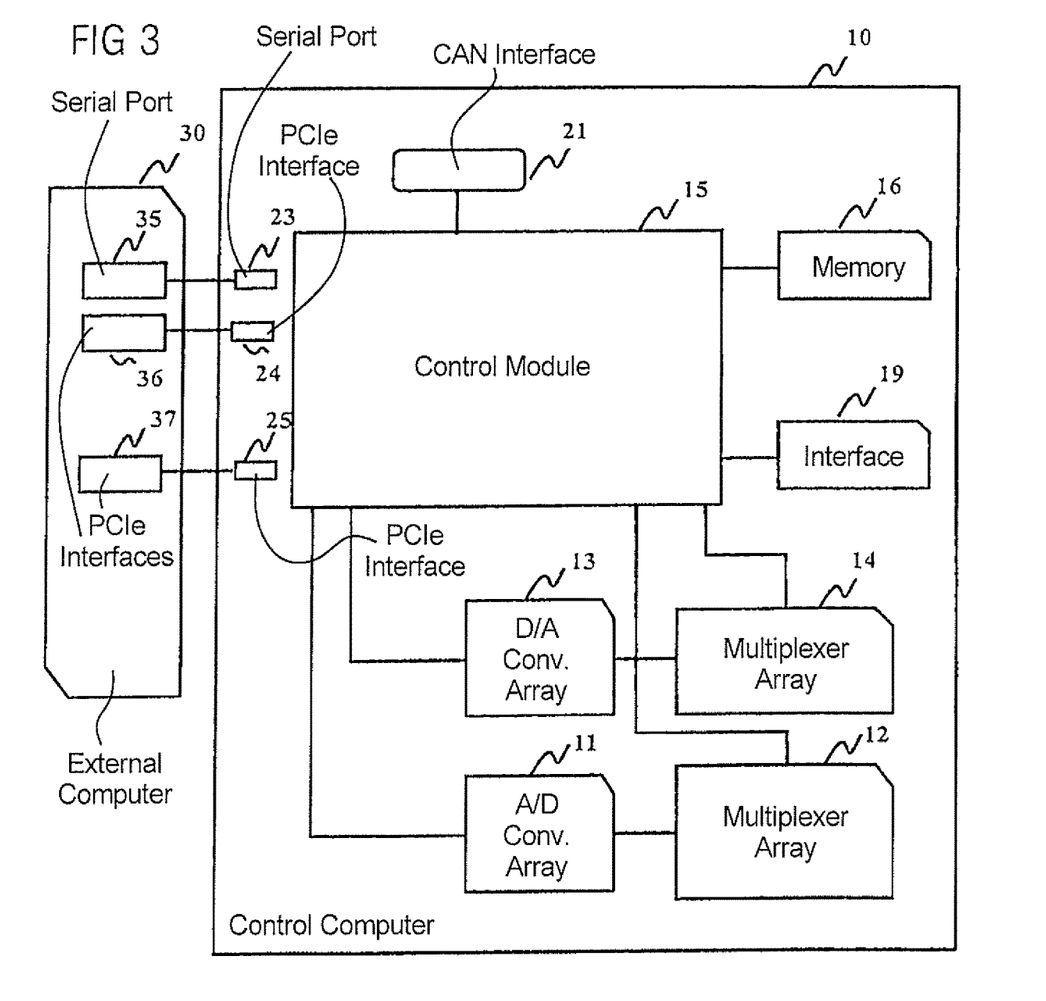
FIG. 3 is a second demonstrative structural diagram of a control computer for an MRI system according to an embodiment of the present invention.

FIG. 3 is a second demonstrative structural diagram of a control computer for an MRI system according to an embodiment of the present invention.

As FIG. 3 shows, the control computer 10 comprises an FPGA 15. The FPGA 15 is separately connected to a digital-to-analog conversion array 13 and an analog-to-digital conversion array 11. A first multiplexer array 12 is connected to the analog-to-digital conversion array 11; a second multiplexer array 14 is connected to the digital-to-analog conversion array 13. The first multiplexer array 12 and second multiplexer array 14 are separately connected to the FPGA 15. The first multiplexer array 12 and second multiplexer array 14 may each be connected to respective amplifiers.

The control computer 10 also comprises a memory 16, a CAN interface 21, a PCIe interface 24, a PCIe interface 25, a serial port 23 and a control interface 19. The control computer 10 can receive control parameters such as magnet temperature monitoring signals and patient table position signals via the CAN interface 21. The control computer 10 can transmit control commands such as patient table position movement commands and magnet temperature control commands via the control interface 19.

The process by which the control computer 10 receives an RF signal from a local coil system of an MRI system specifically comprises: a receiving device (e.g. an RF signal receiving module) connected to the control computer 10 receives an RF signal in analog format from the local coil system of the MRI system; the first multiplexer array 12 selects, on the basis of a control operation of the FPGA 15, an input channel for transmitting the RF signal in analog format to the analog-to-digital conversion array 11. The FPGA 15 also selects, from the analog-to-digital conversion array 11, an analog-to-digital conversion chip to execute an analog-to-digital conversion operation. The analog-to-digital conversion chip selected by the FPGA 15 converts the RF signal in analog format to digital format, then transmits the RF signal in digital format to the FPGA 15.

The process by which the control computer 10 receives an RF feedback signal and a magnetic field gradient feedback signal specifically comprises: a receiving device (e.g. a feedback signal receiving module) connected to the control computer 10 receives an RF feedback signal from an RF signal transmission source, and receives a magnetic field gradient feedback signal from a magnetic field gradient signal transmission source; the first multiplexer array 12 selects, on the basis of a control operation of the FPGA 15, an input channel for transmitting the RF feedback signal and/or the magnetic field gradient feedback signal in analog format to the analog-to-digital conversion array 11. The FPGA 15 also selects, from the analog-to-digital conversion array 11, an analog-to-digital conversion chip to execute an analog-to-digital conversion operation. The analog-to-digital conversion chip selected by the FPGA 15 converts the RF feedback signal in analog format and/or the magnetic field gradient feedback signal in analog format to digital format, then transmits the RF feedback signal in digital format and/or the magnetic field gradient feedback signal in digital format to the FPGA 15.

The process by which the control computer 10 transmits an RF signal to a transmit coil system of an MRI system specifically comprises: the FPGA 15 generates an RF signal in digital format; the FPGA 15 selects, from the digital-to-analog conversion array 13, a digital-to-analog conversion chip to execute a digital-to-analog conversion operation; the digital-to-analog conversion chip selected by the FPGA 15 converts the RF signal in digital format to analog format; the second multiplexer array 14 selects, on the basis of a control operation of the FPGA 15, an output channel for transmitting the RF signal in analog format to an output device (e.g. an RF signal transmitting module). The output device then transmits the RF signal in analog format to the transmit coil system.

The process by which the control computer 10 transmits a magnetic field gradient signal to a gradient coil system of an MRI system specifically comprises: the FPGA 15 generates a magnetic field gradient signal in digital format; the FPGA 15 selects, from the digital-to-analog conversion array 13, a digital-to-analog conversion chip to execute a digital-to-analog conversion operation; the digital-to-analog conversion chip selected by the FPGA 15 converts the magnetic field gradient signal in digital format to analog format; the second multiplexer array 14 selects an output channel for transmitting the magnetic field gradient signal in analog format to an output device (e.g. a magnetic field gradient signal transmitting module). The output device then transmits the magnetic field gradient signal in analog format to the gradient coil system of the MRI system.

After receiving RF signals from the local coil system of the MRI system, the control computer 10 can automatically generate a magnetic resonance image, and supply the magnetic resonance image to an external computer 30 via the PCIe interface 24, the PCIe interface 25 or the serial port 23. The computer 30 has a PCIe interface 36 corresponding to the PCIe interface 24, a PCIe interface 37 corresponding to the PCIe interface 25, and a serial port 35 corresponding to the serial port 23.

Figure 4:
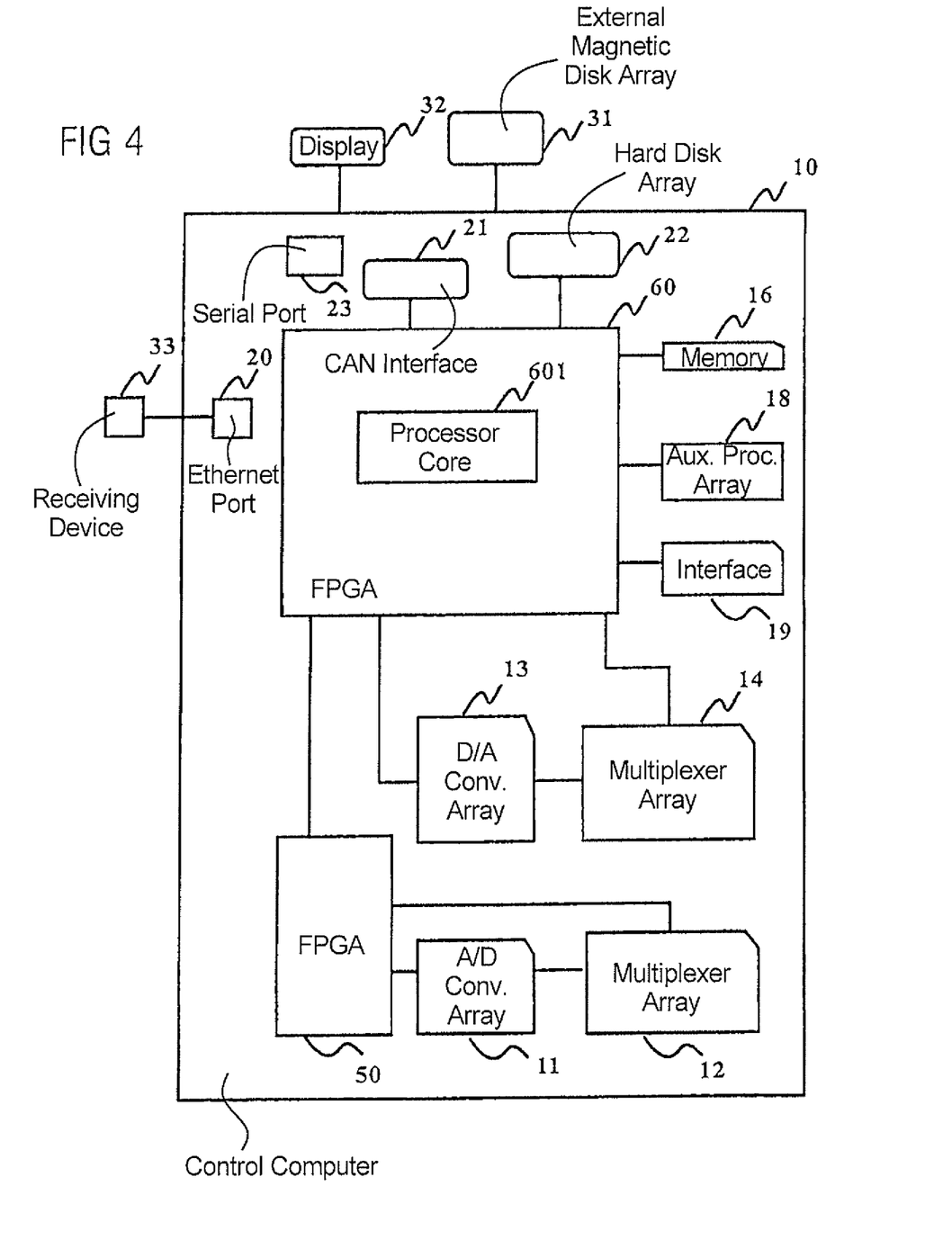
FIG. 4 is a third demonstrative structural diagram of a control computer for an MRI system according to an embodiment of the present invention.

FIG. 4 is a third demonstrative structural diagram of a control computer for an MRI system according to an embodiment of the present invention.

As FIG. 4 shows, the control computer 10 comprises an FPGA 60 with a processor core 601 integrated therein, and one or more FPGA 50 without an integrated processor core. The FPGA 60 and the FPGA 50 together form a control module of the control computer 10. Furthermore, the processor core 601 may specifically be implemented as a CPU core or an MCU core.

The FPGA 60 with the processor core 601 integrated therein is connected to a digital-to-analog conversion array 13. The FPGA 50 without an integrated processor core is connected to an analog-to-digital conversion array 11. Furthermore, a first multiplexer array 12 is connected to the analog-to-digital conversion array 11; a second multiplexer array 14 is connected to the digital-to-analog conversion array 13. The first multiplexer array 12 is connected to the FPGA 50 without an integrated processor core. The second multiplexer array 14 is connected to the FPGA 60 with the processor core 601 integrated therein. The first multiplexer array 12 and second multiplexer array 14 may each be connected to respective amplifiers.

The control computer 10 also comprises a memory 16, an Ethernet port 20, a CAN interface 21, a solid state hard disk array 22, a serial port 23, a control interface 19 and an auxiliary processor array 18 connected to the FPGA 60. The control computer 10 can receive control parameters such as magnet temperature monitoring signals and patient table position signals via the CAN interface 21. The control computer 10 can transmit control commands such as patient table position movement commands and magnet temperature control commands via the control interface 19.

The process by which the control computer 10 receives an RF signal from a local coil system of an MRI system specifically comprises: a receiving device (e.g. an RF signal receiving module) connected to the control computer 10 receives an RF signal in analog format from the local coil system of the MRI system; the first multiplexer array 12 selects, on the basis of a control operation of the FPGA 50 without an integrated processor core, an input channel for transmitting the RF signal in analog format to the analog-to-digital conversion array 11. The FPGA 50 without an integrated processor core selects, from the analog-to-digital conversion array 11, an analog-to-digital conversion chip to execute an analog-to-digital conversion operation. The analog-to-digital conversion chip selected by the FPGA 50 without an integrated processor core converts the RF signal in analog format to digital format, then transmits the RF signal in digital format to the FPGA 50 without an integrated processor core.

The process by which the control computer 10 receives an RF feedback signal and a magnetic field gradient feedback signal specifically comprises: a receiving device (e.g. a feedback signal receiving module) connected to the control computer receives an RF feedback signal from an RF signal transmission source, and receives a magnetic field gradient feedback signal from a magnetic field gradient signal transmission source; the first multiplexer array 12 selects, on the basis of a control operation of the FPGA 50 without an integrated processor core, an input channel for transmitting the RF feedback signal and/or the magnetic field gradient feedback signal in analog format to the analog-to-digital conversion array 11. The FPGA 50 without an integrated processor core selects, from the analog-to-digital conversion array 11, an analog-to-digital conversion chip to execute an analog-to-digital conversion operation. The analog-to-digital conversion chip selected by the FPGA 50 without an integrated processor core converts the RF feedback signal in analog format and/or the magnetic field gradient feedback signal in analog format to digital format, then transmits the RF feedback signal in digital format and/or the magnetic field gradient feedback signal in digital format to the FPGA 50 without an integrated processor core.

The process by which the control computer 10 transmits an RF signal to a transmit coil system of an MRI system specifically comprises: the FPGA 60 with the processor core 601 integrated therein generates an RF signal in digital format; the FPGA 60 with the processor core 601 integrated therein selects, from the digital-to-analog conversion array 13, a digital-to-analog conversion chip to execute a digital-to-analog conversion operation; the digital-to-analog conversion chip selected by the FPGA 60 with the processor core 601 integrated therein converts the RF signal in digital format to analog format; the second multiplexer array 14 selects, on the basis of a control operation of the FPGA 60 with the processor core 601 integrated therein, an output channel for transmitting the RF signal in analog format to an output device (e.g. an RF signal transmitting module). The output device then transmits the RF signal in analog format to the transmit coil system.

The process by which the control computer 10 transmits a magnetic field gradient signal to a gradient coil system of an MRI system specifically comprises: the FPGA 60 with the processor core 601 integrated therein generates a magnetic field gradient signal in digital format; the FPGA 60 with the processor core 601 integrated therein selects, from the digital-to-analog conversion array 13, a digital-to-analog conversion chip to execute a digital-to-analog conversion operation; the digital-to-analog conversion chip selected by the FPGA 60 with the processor core 601 integrated therein converts the magnetic field gradient signal in digital format to analog format; the second multiplexer array 14 selects an output channel for transmitting the magnetic field gradient signal in analog format to an output device (e.g. a magnetic field gradient signal transmitting module). The output device then transmits the magnetic field gradient signal in analog format to the gradient coil system of the MRI system.

After receiving RF signals from the local coil system of the MRI system, the control computer 10 can automatically generate a magnetic resonance image, and transmit the magnetic resonance image by Ethernet communication via the Ethernet port 20 to an external device 33. Optionally, after receiving RF signals from the local coil of the MRI system, the control computer 10 may also generate a magnetic resonance image in cooperation with the external device 33. In this case, the control computer 10 interacts with the external device 33 by Ethernet communication via the Ethernet port 20 to generate the magnetic resonance image. The control computer 10 may also be connected to a display 32 via the serial port 23, to display the magnetic resonance image.

The present invention may be implemented in many ways. For example, the digital control system proposed in the present invention may be printed on a printed circuit board which serves as a signal processing board of the MRI system.

The present invention also proposes a signal processing board for an MRI system.

Figure 5:
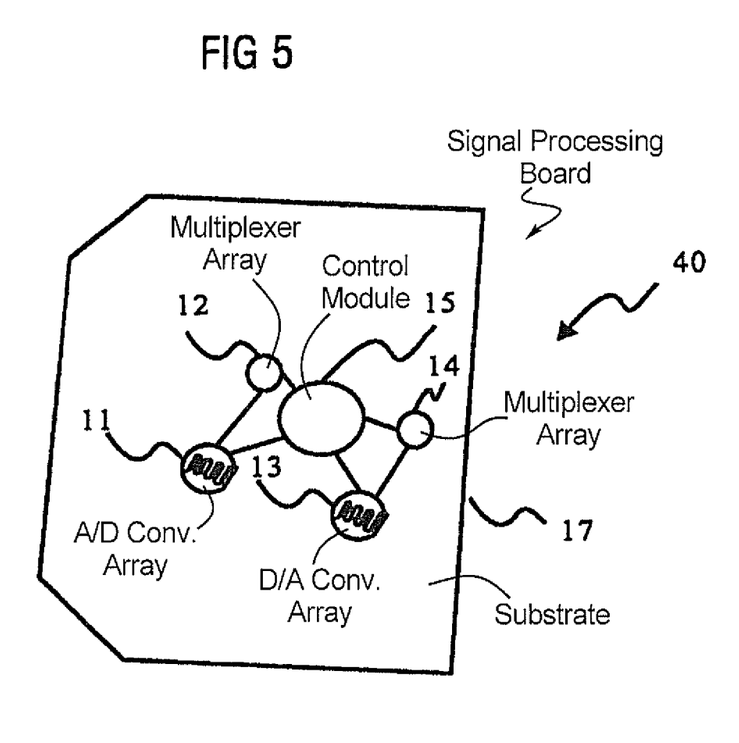
FIG. 5 is a structural diagram of a signal processing board for an MRI system according to an embodiment of the present invention.

FIG. 5 is a structural diagram of a signal processing board for an MRI system according to the present invention.

As FIG. 5 shows, the signal processing board 40 comprises:
a substrate 17;
an analog-to-digital conversion array 11 arranged on the substrate 17;
a first multiplexer array 12 arranged on the substrate 17 and connected to the analog-to-digital conversion array 11;
a control module 15 arranged on the substrate 17, for receiving one or more input signals by means of the first multiplexer array 12 and the analog-to-digital conversion array 11.

Preferably, the signal processing board 40 may also comprise a digital-to-analog converter arranged on the substrate 17.

Preferably, the signal processing board 40 may also comprise: a digital-to-analog conversion array 13 arranged on the substrate 17; a second multiplexer array 14 arranged on the substrate 17 and connected to the digital-to-analog conversion array 13; wherein the control module 15 arranged on the substrate 17 is also used for transmitting one or more output signals by means of the digital-to-analog conversion array 13 and the second multiplexer array 14.

Specifically, the substrate 17 may be implemented as: FR-1; FR-2; FR-3; FR-4; FR-5; FR-6; G-10; CEM-1; CEM-2; CEM-3; CEM-4; CEM-5; aluminum nitride (AlN); silicon carbide (SiC) etc.

In one embodiment, the input signal comprises at least one of the following: an RF signal; an RF feedback signal; a magnetic field gradient feedback signal; a control instruction containing a control parameter; and/or the output signal comprises at least one of the following: an RF signal; a magnetic field gradient signal; a control command.

In one embodiment, the control module 15 comprises: one or more FPGAs; or one FPGA with one or more processor cores integrated therein; or one or more processors and one or more FPGAs; or one or more processors and one or more auxiliary processor arrays; or one or more FPGAs and one or more auxiliary processor arrays; or one or more processors.

One embodiment also comprises: a first amplifier arranged on the substrate 17 and connected to the first multiplexer array 12, for amplifying input signals; and/or a second amplifier arranged on the substrate 17 and connected to the second multiplexer array 14, for amplifying output signals.

One embodiment also comprises at least one of the following: an Ethernet port arranged on the substrate 17; a display interface arranged on the substrate 17; a controller local area network port arranged on the substrate 17; a serial port arranged on the substrate 17.

In summary, in the embodiments of the present invention, the control computer comprises: an analog-to-digital conversion array; a first multiplexer array connected to the analog-to-digital conversion array; a control module, for receiving one or more input signals by means of the first multiplexer array and the analog-to-digital conversion array. Clearly, the embodiments of the present invention can receive any number of input signals of any type, at any input port. Furthermore, the embodiments of the present invention can also output any number of output signals of any type, at any output port; therefore, the embodiments of the present invention can increase configurability and expandability, as well as reducing costs.

Furthermore, in the embodiments of the present invention, a processor core may be integrated in an FPGA, thereby significantly lowering costs. Moreover, in the embodiments of the present invention, the processing performance of the control module can also be improved through the introduction of an auxiliary processor array.

The embodiments above are merely preferred embodiments of the present invention, which are not intended to define the scope of protection of the present invention. Any amendments, equivalent substitutions or improvements etc. made within the spirit and principles of the present invention shall be included in the scope of protection thereof.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A control computer configured for a magnetic resonance (MR) imaging system comprising:
    an analog-to-digital conversion array;
    a first multiplexer array connected to the analog-to-digital conversion array;
    a digital-to-analog conversion array;
    a second multiplexer array connected to the digital-to-analog conversion array;
    a control module configured to: receive at least one input signal including a magnetic field gradient signal that is related to an operation of said MR imaging system, via said first multiplexer array and said analog-to-digital conversion array;
    said control module being configured to: produce at least one output signal, also related to said operation of said MR imaging system, from said at least one input signal, and cause said at least one output signal to be emitted via said second multiplexer array and said digital-to-analog conversion array; and
    said control module comprising at least one field programmable gate array (FPGA) that operates each of said first and second multiplexer arrays so as to select and set a number of channels respectively in said analog-to-digital conversion array and said digital-to-analog conversion array in which said at least one input signal including the magnetic field gradient signal, and said at least one output signal proceed.

2. The control computer as claimed in claim 1 wherein said input signal further comprises at least one of: a radio-frequency (RF) signal, an RF feedback signal, a magnetic field gradient feedback signal, and a control instruction containing a control parameter.

3. The control computer as claimed in claim 1 wherein said output signal further comprises at least one of: a radio-frequency signal, and a control command.

4. The control computer as claimed in claim 1, wherein said control module comprises one of:
    said at least one FPGA with at least one processor core integrated therein;
    at least one processor and said at least one FPGA;
    said at least one FPGA and at least one auxiliary processor array.

5. The control computer as claimed in claim 1, further comprising:
    a first amplifier connected to the first multiplexer array, said first amplifier amplifying said input signal; and
    a second amplifier connected to said second multiplexer array, said second amplifier amplifying said output signal.

6. The control computer as claimed in claim 1 further comprising at least one of an Ethernet port, a display interface, a local area network controller port, and a serial port.

7. A signal processing board configured for a magnetic resonance imaging system, comprising:
    a substrate;
    an analog-to-digital conversion array on said substrate;
    a first multiplexer array on said substrate, connected to said analog-to-digital conversion array;
    a digital-to-analog conversion array on said substrate;
    a second multiplexer array on said substrate, connected to the digital-to-analog conversion array;
    a control module on said substrate configured to receive at least one input signal, related to an operation of said MR imaging system, via said first multiplexer array and said analog-to-digital conversion array;
    said control module being configured to: produce at least one output signal, also related to said operation of said MR imaging system, from said at least one input signal, and cause said at least one output signal to be emitted via said second multiplexer array and said digital-to-analog conversion array; and
    said control module comprising at least one field programmable gate array (FPGA) that operates each of said first and second multiplexer arrays so as to select and set a number of channels respectively in said analog-to-digital conversion array and said digital-to-analog conversion array in which said at least one input signal and said at least one output signal proceed.

8. The signal processing board as claimed in claim 7 wherein said input signal comprises at least one of radio-frequency (RF) signal, an RF feedback signal, a magnetic field gradient feedback signal, and a control instruction containing a control parameter.

9. The signal processing board as claimed in claim 7 wherein said output signal comprises at least one of a radio-frequency signal, a magnetic field gradient signal, and a control command.

10. The signal processing board as claimed in claim 7, wherein said control module comprises one of:
    said at least one FPGA with at least one processor core integrated therein;
    at least one processor and said at least one FPGA;
    said at least one FPGA and at least one auxiliary processor array.

11. The signal processing board as claimed in claim 7, further comprising, on said substrate:
    a first amplifier connected to the first multiplexer array, said first amplifier amplifying said input signal; and
    a second amplifier connected to said second multiplexer array, said second amplifier amplifying said output signal.

* * * * *